United States Patent
Kobayashi et al.

(10) Patent No.: US 10,510,640 B2
(45) Date of Patent: Dec. 17, 2019

(54) SEMICONDUCTOR DEVICE AND METHOD FOR MANUFACTURING SEMICONDUCTOR DEVICE

(71) Applicant: Mitsubishi Electric Corporation, Chiyoda-ku (JP)

(72) Inventors: Hiroshi Kobayashi, Tokyo (JP); Shinnosuke Soda, Tokyo (JP); Yohei Omoto, Tokyo (JP); Komei Hayashi, Tokyo (JP)

(73) Assignee: Miitsubishi Electric Corporation, Chiyoda-ku (JP)

( * ) Notice: Subject to any disclaimer, the term of this patent is extended or adjusted under 35 U.S.C. 154(b) by 10 days.

(21) Appl. No.: 15/518,368

(22) PCT Filed: Sep. 14, 2015

(86) PCT No.: PCT/JP2015/075944
§ 371 (c)(1),
(2) Date: Apr. 11, 2017

(87) PCT Pub. No.: WO2016/121159
PCT Pub. Date: Aug. 4, 2016

(65) Prior Publication Data
US 2017/0309544 A1  Oct. 26, 2017

(30) Foreign Application Priority Data
Jan. 26, 2015 (JP) .................. 2015-012184

(51) Int. Cl.
*H01L 23/473* (2006.01)
*H01L 21/48* (2006.01)
(Continued)

(52) U.S. Cl.
CPC ........ *H01L 23/473* (2013.01); *H01L 21/4882* (2013.01); *H01L 23/367* (2013.01);
(Continued)

(58) Field of Classification Search
CPC ............... H01L 21/4882; H01L 23/373; H01L 23/36–3738
See application file for complete search history.

(56) References Cited

U.S. PATENT DOCUMENTS 6,309,737 B1* 10/2001 Hirashima ............ C04B 37/026
174/258
8,735,729 B2* 5/2014 Mori .................... H01L 23/3735
174/252
(Continued)

FOREIGN PATENT DOCUMENTS

JP  2006-294699 A  10/2006
JP  2008-28295 A  2/2008
(Continued)

OTHER PUBLICATIONS

International Search Report dated Dec. 8, 2015 in PCT/JP2015/075944 filed Sep. 14, 2015.

Primary Examiner — Stephen M Bradley
(74) Attorney, Agent, or Firm — Oblon, McClelland, Maier & Neustadt, L.L.P.

(57) ABSTRACT

A semiconductor device and a method for manufacturing the semiconductor device. The semiconductor device includes an insulating substrate, a semiconductor chip, a plate member, and a cooler. The insulating substrate includes insulating ceramics serving as an insulating plate, and conductive plates provided on opposite surfaces of the insulating ceramics. The semiconductor chip is provided on an upper surface of the insulating substrate. The plate member is bonded to a lower surface of the insulating substrate. The cooler is bonded to a lower surface of the plate member. At least one of bonding between a lower surface of the insulating substrate and the plate member and bonding between a lower surface of the plate member and the cooler is performed via a bonding member composed mainly of tin. Also, a cyclic stress of the plate member is smaller than a tensile strength of the bonding member.

14 Claims, 15 Drawing Sheets

(51) Int. Cl.
  *H01L 23/367* (2006.01)
  *H05K 3/00* (2006.01)
  *H05K 3/34* (2006.01)
  *H01L 23/373* (2006.01)
  *H05K 1/03* (2006.01)
  *H05K 3/40* (2006.01)

(52) U.S. Cl.
  CPC ........... *H05K 3/0061* (2013.01); *H05K 3/341* (2013.01); *H01L 23/3677* (2013.01); *H01L 23/3735* (2013.01); *H01L 2924/0002* (2013.01); *H05K 1/0306* (2013.01); *H05K 3/4015* (2013.01); *H05K 2201/0373* (2013.01); *H05K 2201/0969* (2013.01); *H05K 2201/09681* (2013.01)

(56) References Cited

U.S. PATENT DOCUMENTS

| | | | | |
|---|---|---|---|---|
| 8,736,052 B2* | 5/2014 | Oeschler | ................. | H01L 24/29 257/737 |
| 9,837,363 B2* | 12/2017 | Oi | ........................... | H01L 24/40 |
| 2004/0042181 A1* | 3/2004 | Nagasaki | ................ | H01L 35/08 361/725 |
| 2004/0207987 A1* | 10/2004 | Ishikawa | ............. | H01L 23/3736 361/709 |
| 2008/0093729 A1* | 4/2008 | Siepe | ................. | H01L 23/3735 257/703 |
| 2009/0134501 A1* | 5/2009 | Ganitzer | ............... | H01L 23/488 257/666 |
| 2009/0139704 A1 | 6/2009 | Otoshi et al. | | |
| 2009/0229864 A1* | 9/2009 | Kuromitsu | .......... | H01L 23/3735 174/252 |
| 2010/0109016 A1* | 5/2010 | Yagi | .................... | H01L 23/3735 257/76 |
| 2012/0267149 A1* | 10/2012 | Oi | ....................... | H01L 21/4807 174/255 |
| 2013/0164559 A1* | 6/2013 | Mikami | .................. | C22C 21/00 428/687 |
| 2013/0277034 A1 | 10/2013 | Iwata et al. | | |
| 2014/0318831 A1* | 10/2014 | Nishikawa | .............. | H01L 23/36 174/252 |
| 2015/0034367 A1* | 2/2015 | Nagatomo | ............... | H01L 23/36 174/252 |
| 2015/0366048 A1* | 12/2015 | Nagase | ................ | H01L 23/3735 174/252 |
| 2016/0021729 A1* | 1/2016 | Nagatomo | .............. | H01L 25/07 361/748 |
| 2016/0221305 A1* | 8/2016 | Terasaki | ................ | C04B 37/026 |

FOREIGN PATENT DOCUMENTS

| | | | | |
|---|---|---|---|---|
| JP | 2010-177414 A | 8/2010 | | |
| JP | 2012-146864 A | 8/2012 | | |
| JP | 2013-222930 A | 10/2013 | | |
| JP | WO 2014115677 A1 * | 7/2014 | ......... | H01L 23/3735 |
| WO | 2014/115677 A1 | 7/2014 | | |

\* cited by examiner

F I G. 1 1
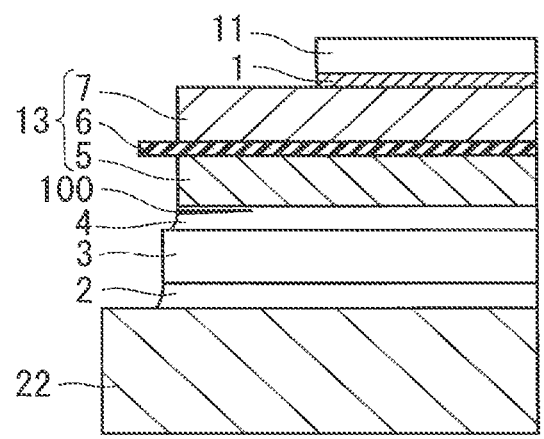
F I G. 1 2
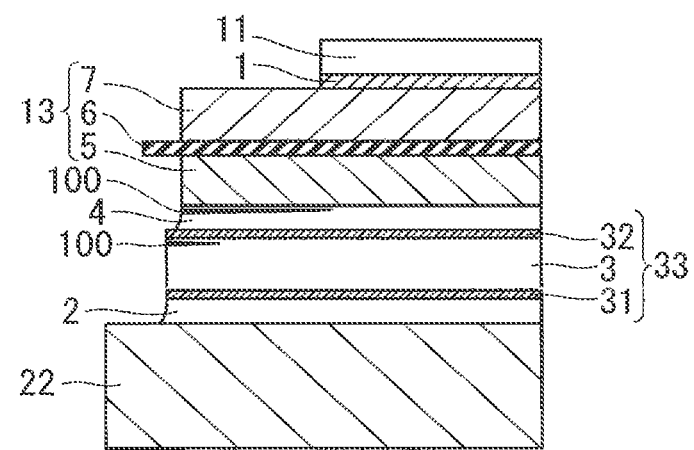

FIG. 13
| | STATIC STRESS (MPa) | CYCLIC STRESS (MPa) |
|---|---|---|
| A MEMBER | 13 | 20 |
| B MEMBER | 15 | 25 |
| C MEMBER | 18 | 30 |
FIG. 14
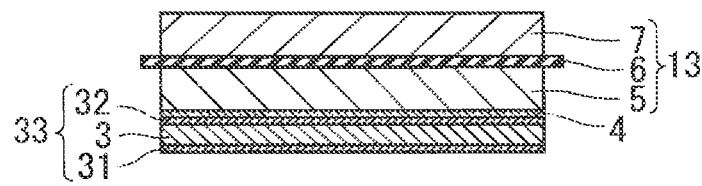
FIG. 15
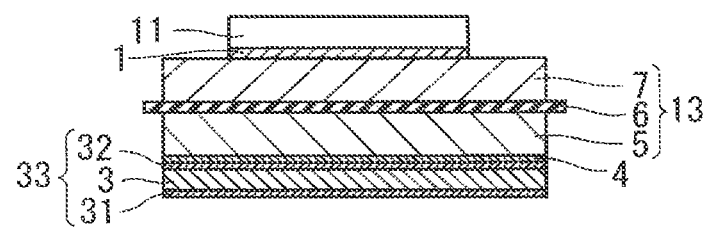

F I G. 1 8
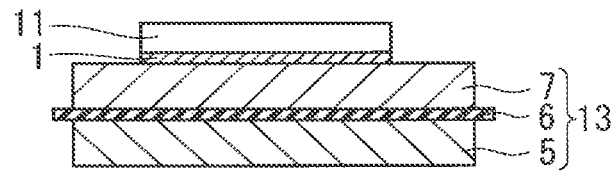
F I G. 1 9
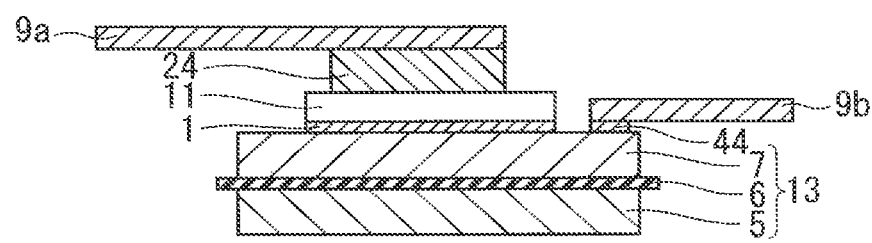
F I G. 2 0
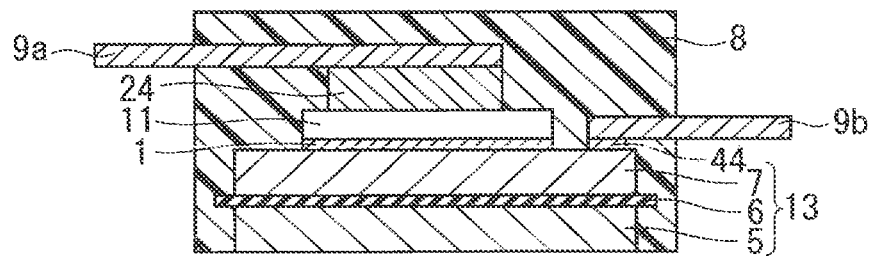

SEMICONDUCTOR DEVICE AND METHOD FOR MANUFACTURING SEMICONDUCTOR DEVICE

TECHNICAL FIELD

The present techniques relate to a semiconductor device and a method for manufacturing a semiconductor device, and particularly relate to a semiconductor device which is required to have heat dissipation properties, and a method for manufacturing such a semiconductor device.

BACKGROUND ART

In a semiconductor device (power module) which uses a power semiconductor chip such as a silicon-carbide metal oxide semiconductor-field effect transistor (SiC MOSFET) or a silicon insulated gate bipolar transistor (Si IGBT), there is a need to efficiently dissipate heat generated from a semiconductor chip, and keep a temperature of a semiconductor chip at a predetermined temperature or lower.

Conventionally, provided is a power module in which a semiconductor chip is bonded to one of surfaces of a so-called insulating substrate which is formed by integration of: an insulating ceramic plate of high thermal conductivity such as silicon nitride, silicon aluminum, or alumina; and conductive plates formed of a metal of high thermal conductivity such as aluminum or copper (including an alloy thereof, and the same shall apply hereinafter), which are provided on opposite surfaces of the insulating ceramic plate, via a bonding member such as solder, and a cooler is bonded directly or indirectly to the other of the surfaces of the insulating substrate via a bonding member such as solder.

However, depending on a use condition, a thermal stress is caused due to a difference in thermal expansion coefficient between the insulating substrate and the cooler, and a crack occurs in a bonding member which bonds the insulating substrate and the cooler, so that satisfactory heat dissipation properties cannot be maintained throughout a required lifetime in some cases.

Thus, in order to solve the foregoing problems, there is made a suggestion that a stress relieving member is placed between the insulating substrate and the cooler (refer to Patent Document 1, for example).

A stress relieving member in Patent Document 1 includes an aluminum plate member which has a thickness of not less than 0.3 mm and not more than 3 mm and has a plurality of through holes which are formed therein to serve as stress accommodating spaces. The stress relieving member is brazed to the insulating substrate and a heat sink. By virtue of actions of the stress accommodating spaces, the stress relieving member is deformed, so that a thermal stress is relieved.

PRIOR ART DOCUMENTS

Patent Documents

Patent Document 1: Japanese Patent Application Laid-Open No. 2006-294699

SUMMARY OF INVENTION

Problems to be Solved by the Invention

Nonetheless, a semiconductor device including such a stress relieving member having a stress accommodating space as described in Patent Document 1 has some problems.

For example, there is a problem regarding heat transfer properties. An average heat-transfer rate of a stress relieving member is lower than an average heat-transfer rate of a base member. This is because a stress accommodating space of a stress relieving member is air, a heat-transfer rate of which is extremely low. Accordingly, an average heat-transfer rate of a stress relieving member is lower than a heat-transfer rate of a base member by a proportion of a volume of a stress accommodating space. Also, in a stress relieving member which has preferably a thickness of not less than 1 mm and not more than 4 mm, heat flow does not sufficiently spread. This is because heat flow is obstructed by a stress accommodating space.

The present techniques have been devised in order to solve the foregoing problems, and relate to a semiconductor device which allows satisfactory heat transfer, and to a method for manufacturing such a semiconductor device.

Means for Solving the Problems

A semiconductor device according to one aspect of the present techniques includes: an insulating substrate including an insulating plate and conductive plates which are provided on opposite surfaces of the insulating plate; a semiconductor chip provided on an upper surface of the insulating substrate; a plate member bonded to a lower surface of the insulating substrate; and a cooler bonded to a lower surface of the plate member, wherein at least one of bonding between the lower surface of the insulating substrate and the plate member and bonding between the lower surface of the plate member and the cooler is performed via a bonding member which is composed mainly of tin, and a cyclic stress of the plate member is smaller than a tensile strength of the bonding member.

A method for manufacturing a semiconductor device according to one aspect of the present techniques includes: bonding an upper surface of an insulating substrate which includes an insulating plate and conductive plates which are provided on opposite surfaces of the insulating plate, to a semiconductor chip; bonding a lower surface of the insulating substrate and a plate member; and bonding a lower surface of the plate member and a cooler, wherein at least one of bonding between the lower surface of the insulating substrate and the plate member and bonding between the lower surface of the plate member and the cooler is performed via a bonding member which is composed mainly of tin, a cyclic stress of the plate member is smaller than a tensile strength of the bonding member, and a temperature at which bonding is performed via the bonding member is lower than a temperature at which the upper surface of the insulating substrate is bonded to the semiconductor chip.

Effects of the Invention

A semiconductor device according to one aspect of the present techniques includes: an insulating substrate including an insulating plate and conductive plates which are provided on opposite surfaces of the insulating plate; a semiconductor chip provided on an upper surface of the insulating substrate; a plate member bonded to a lower surface of the insulating substrate; and a cooler bonded to a lower surface of the plate member, wherein at least one of bonding between the lower surface of the insulating substrate and the plate member and bonding between the lower surface of the plate member and the cooler is performed via a bonding member which is composed mainly of tin, and a cyclic stress of the plate member is smaller than a tensile strength of the bonding member.

Because of the foregoing configuration, since the cyclic stress of the plate member is smaller than the tensile strength of the bonding member, it is possible to reduce metal fatigue of the bonding member which is induced by a thermal stress caused due to a difference in a thermal expansion coefficient, while maintaining satisfactory heat transfer properties.

A method for manufacturing a semiconductor device according to one aspect of the present techniques includes: bonding an upper surface of an insulating substrate which includes an insulating plate and conductive plates which are provided on opposite surfaces of the insulating plate, to a semiconductor chip; bonding a lower surface of the insulating substrate and a plate member; and bonding a lower surface of the plate member and a cooler, wherein at least one of bonding between the lower surface of the insulating substrate and the plate member and bonding between the lower surface of the plate member and the cooler is performed via a bonding member which is composed mainly of tin, a cyclic stress of the plate member is smaller than a tensile strength of the bonding member, and a temperature at which bonding is performed via the bonding member is lower than a temperature at which the upper surface of the insulating substrate is bonded to the semiconductor chip.

Because of the foregoing configuration, since the cyclic stress of the plate member is smaller than the tensile strength of the bonding member, it is possible to reduce metal fatigue of the bonding member which is induced by a thermal stress caused due to a difference in a thermal expansion coefficient, while maintaining satisfactory heat transfer properties.

The objects, features, aspects and advantages of the present techniques will become more apparent from the following detailed description when taken in conjunction with the accompanying drawings.

BRIEF DESCRIPTION OF DRAWINGS

FIG. 11 schematically shows a cross section of a submodule regarding the embodiments after a temperature cycling test (C member).

FIG. 12 schematically shows a cross section of a submodule regarding the embodiments after a temperature cycling test (C member with a laminated plate member).

FIG. 13 shows examples of respective static and cyclic stresses each with a distortion of approximately 2%, of A member, B member, and C member at approximately 125° C.

FIG. 14 is a view for explaining a method for manufacturing a semiconductor device regarding the embodiments (a bonding step).

FIG. 15 is a view for explaining a method for manufacturing a semiconductor device regarding the embodiments (a die-bonding step).

FIG. 18 is a view for explaining a method for manufacturing a semiconductor device regarding the embodiments (a die-bonding step).

FIG. 19 is a view for explaining a method for manufacturing a semiconductor device regarding the embodiments (a bonding step).

FIG. 20 is a view for explaining a method for manufacturing a semiconductor device regarding the embodiments (a resin forming step).

DESCRIPTION OF EMBODIMENTS

Figure 1:
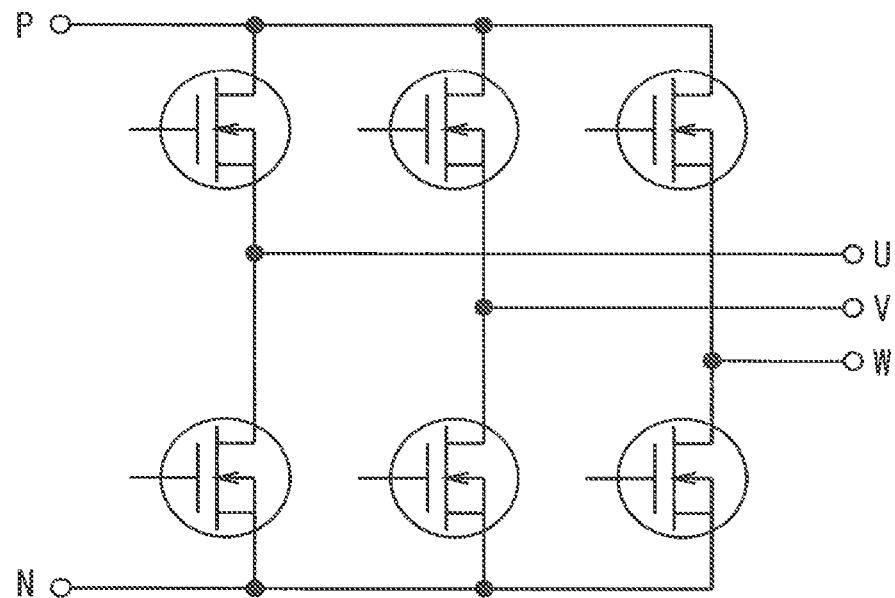
FIG. 1 is a circuit diagram of a power module for a three-phase inverter using a MOSFET, as one example of a semiconductor device regarding embodiments.

Hereinafter, embodiments will be described with reference to accompanying drawings. It is noted that the drawings provide schematic representations, and respective sizes and positional interrelationships of figures in different drawings are not necessarily shown exactly and can be appropriately changed. Also, in the following description, the same components will be shown in the drawings while being denoted by the same reference symbols, and names and functions thereof shall be similar. Thus, detailed description for such components will be occasionally omitted.

Also, while the following description will use terms which mean specific positions and directions such as "upper", "lower", "side", "bottom", "front", and "rear" in some portions, those terms are used for the sake of convenience in order to facilitate understanding of contents of the embodiments, and are not pertinent to directions for actual implementation.

First Embodiment

<Configuration>

Below, in portions where symbols of elements or names of materials such as copper (Cu) or aluminum (Al) are described without specific statements, elements or materials including other additives such as a copper alloy or an aluminum alloy, for example, shall be included.

Figure 2:
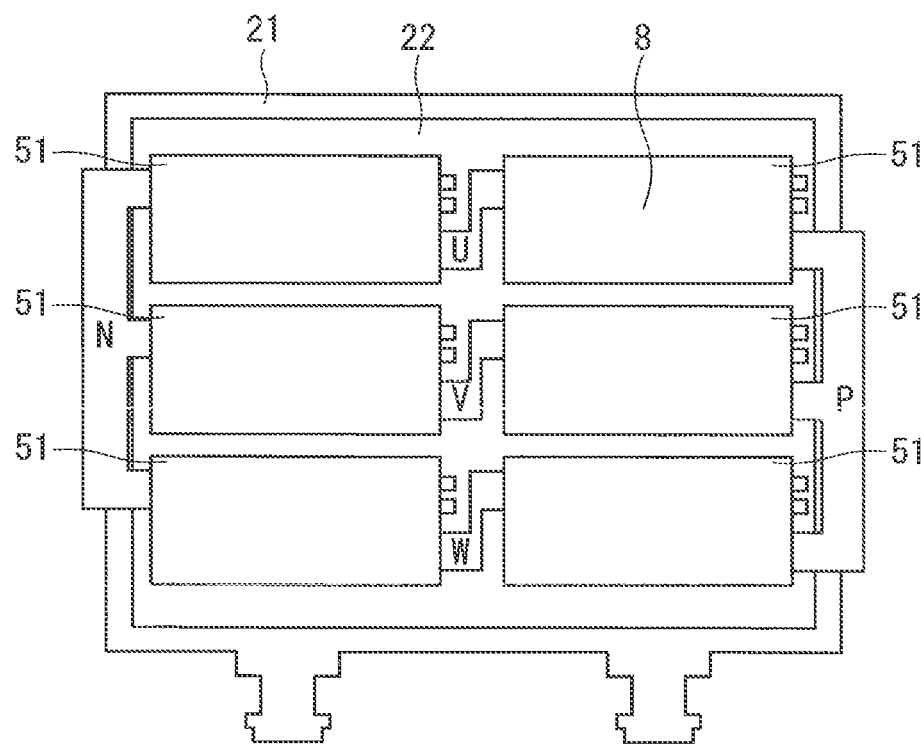
FIG. 2 is a top view of a power module regarding the embodiments in a case where the power module is formed of one-in-one submodules.
Figure 3:
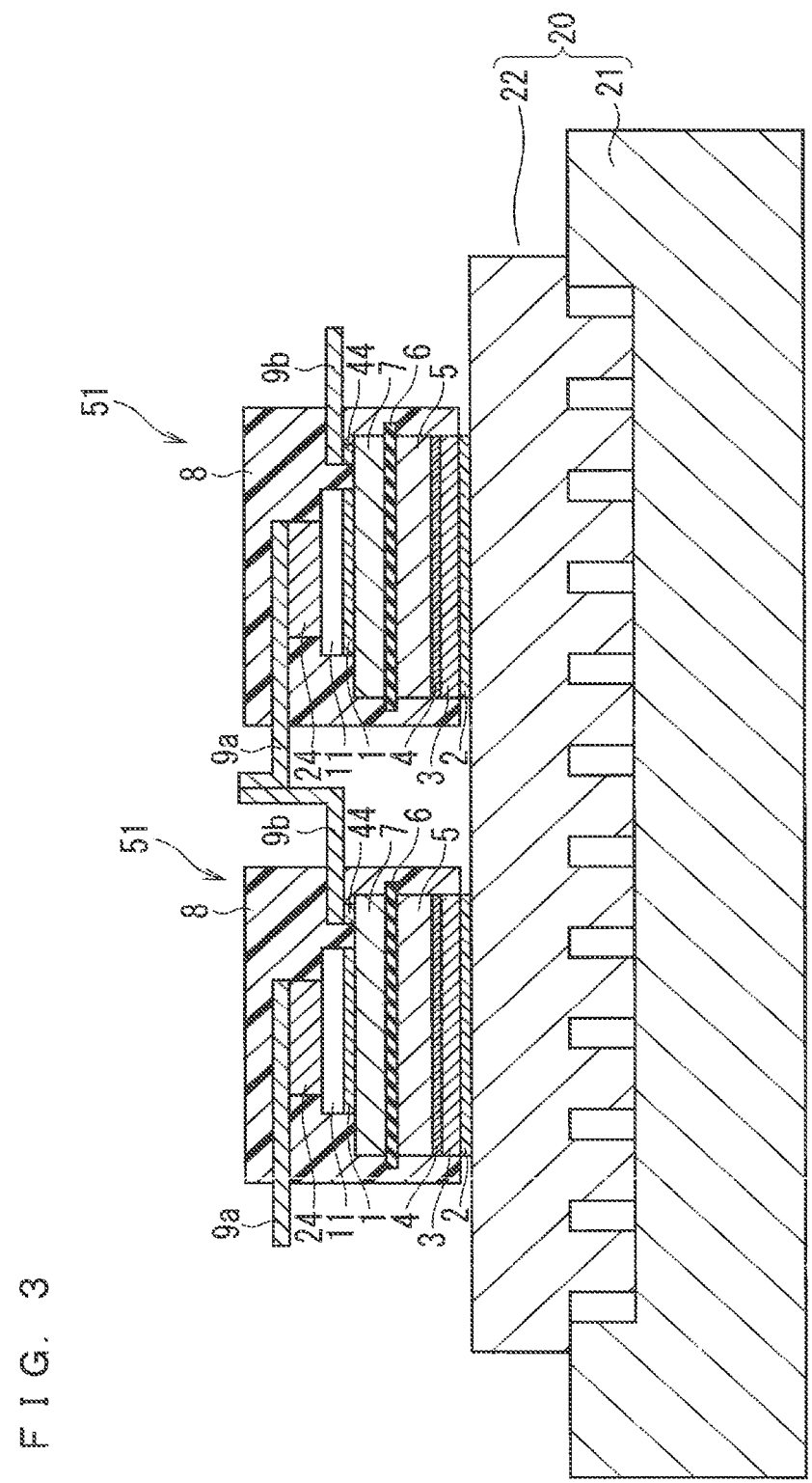
FIG. 3 is a cross-sectional view of a power module regarding the embodiments in a case where the power module is formed of one-in-one submodules.

FIG. 1 is a circuit diagram of a power module for a three-phase inverter using a MOSFET as one example of a semiconductor device regarding the present embodiment. Also, FIG. 2 is a top view of the power module regarding the present embodiment in a case where the power module is formed of one-in-one submodules (one arm is provided per submodule). In this regard, while an arm is a unit corresponding to one MOSFET serving as a semiconductor element in a case illustratively shown in FIG. 1, an arm corresponds to a plurality of MOSFETs in a case where a plurality of MOSFETs are connected in parallel to serve as switching elements, for example. Also, in a case of an IGBT, for example, an arm corresponds to a combination of a switching element and a diode. Further, FIG. 3 is a cross-sectional view of the power module regarding the present embodiment in a case where the power module is formed of one-in-one submodules. Moreover, FIG. 4 is a cross-sectional view of a submodule.

First, a configuration of the power module regarding the present embodiment will be described.

Figure 4:
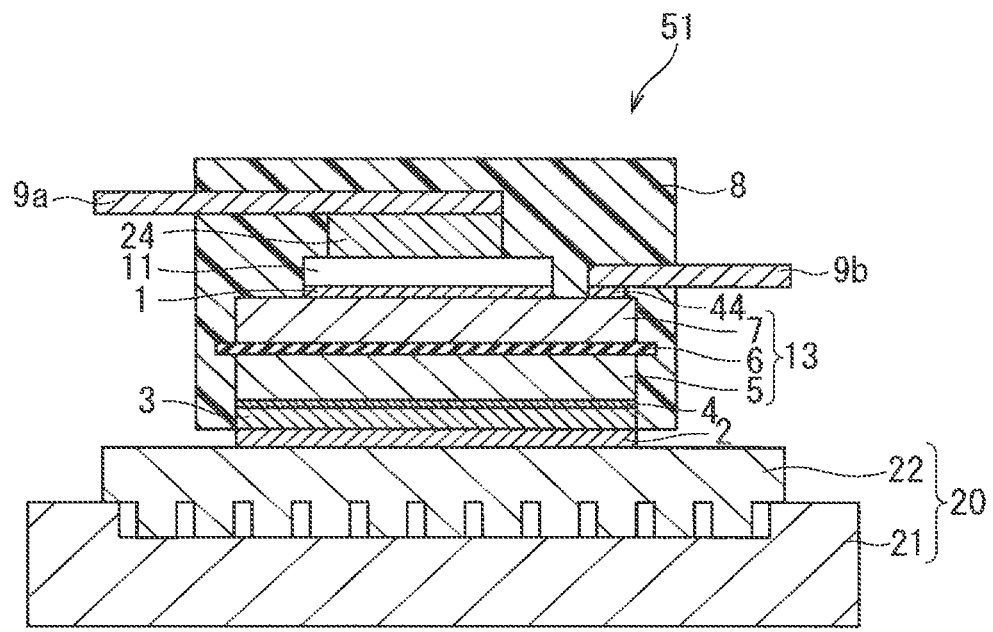
FIG. 4 is a cross-sectional view of a submodule regarding the embodiments.

As illustratively shown in FIG. 3 or FIG. 4, a lower surface of a semiconductor chip 11 which performs a switching operation, such as an SiC MOSFET, is electrically, mechanically and thermally bonded to an insulating substrate 13 via a bonding member 1. Also, an upper surface of the semiconductor chip 11 is bonded to a lead frame 9a via a bonding member 24.

The insulating substrate 13 includes a conductive plate 5 which has excellent thermal conductivity and excellent electrical conductivity, a conductive plate 7 which has excellent thermal conductivity and excellent electrical conductivity, and insulating ceramics 6. The conductive plate 7, the insulating ceramics 6, and the conductive plate 5 are stacked in the stated order from an upper surface of the insulating substrate 13 toward a lower surface. The conductive plate 7 which is an upper surface of the insulating substrate 13 is bonded to the semiconductor chip 11 via the bonding member 1. The conductive plate 5 which is a lower surface of the insulating substrate 13 is mechanically and thermally bonded to a cooler 20 via a bonding member 4, an aluminum plate member 3 which has excellent thermal conductivity and is easily deformed, and a bonding member 2. The bonding member 4, the aluminum plate member 3, and the bonding member 2 are stacked in the stated order from the top toward the bottom. Also, the conductive plate 7 which is an upper surface of the insulating substrate 13 is bonded to a lead frame 9b via a bonding member 44.

Further, the power module regarding the present embodiment includes a sealing member 8 with which the semiconductor chip 11 and the insulating substrate 13 are covered.

The cooler 20 includes a cooler top plate 22 which is mechanically and thermally bonded to the conductive plate 5 via the bonding member 4, the aluminum plate member 3, and the bonding member 2, and a water jacket 21 which is placed under the cooler top plate 22. A lower surface of the cooler top plate 22 which is an undersurface of the cooler top plate 22 is provided with a fin-shaped portion 22a.

Each of submodules 51 (six submodules in FIG. 1) which includes the semiconductor chip 11 and the insulating substrate 13 bonded to the semiconductor chip 11 is sealed with the sealing member 8. Then, the submodules 51 are electrically connected to each other via the lead frame 9a and the lead frame 9b.

Next, composing members in the first embodiment will be described.

As a material of the bonding member 1, a sintered material of an Ag (silver) nanoparticle which is a covered silver ultrafine particle covered with an organic protecting molecule is conceived, for example. That material, which has higher thermal conductivity than solder, would hardly cause high temperature degradation. Also, that material has high resistance to a power cycle and a heat cycle, and thus can be used at a high chip junction (Tj) temperature. Further, that material is suitable for use in combination with a semiconductor chip which uses SiC and is so hard as to tend to give a distortion to a bonding member due to a thermal stress.

As a material of the bonding member 2, Sn—Cu—Sb solder which is composed mainly of tin and has a high strength is conceived, for example. In this regard, a bonding member which is composed mainly of tin includes; Sn—Cu-based solder including Sn—Cu—Sb; Sn—Sb-based solder; Sn—Ag-based solder; combinations of the above; so-called Sn-based lead-free solder or tin foil which is doped with Ni, In, Ti, or the like and has a liquidus not exceeding 300° C.; and a substance resulted from liquid phase diffusion bonding using foil or paste of a mixture of the Sn-based lead-free solder or the tin foil with a small amount of other elements. In a case of such an Sn—Cu—Sb solder material which is composed mainly of tin and has a high strength as in the above examples, a liquidus is not lower than approximately 240° C. and not higher than approximately 300° C., and thus is sufficiently lower than a melting point of sintered Ag of the bonding member 1. Also, in this embodiment, it is preferable that a composition ratio of antimony (Sb) is adjusted to be six wt % or larger, for example, in order to keep a tensile strength at approximately 125° C. equal to approximately 25 MPa or higher. However, if a composition ratio of Sb is too high, a difference between a solidus and a liquidus becomes large, which makes handling difficult. An upper limit of a composition ratio is fifteen wt % or smaller which allows a difference between a solidus and a liquidus to be 50° C. or lower when a liquidus is 300° C. or lower, and is preferably twelve wt % or smaller.

As a material of the aluminum plate member 3, ultra-pure aluminum with a purity of 99.999% or higher is conceived, for example. That material has a proof stress (tensile strength) of approximately 25 MPa or lower at approximately 125° C., and a proof stress (tensile strength) thereof does not exceed approximately 25 MPa even if repeated curing is performed at approximately 125° C. In other words, a cyclic stress does not exceed approximately 25 MPa.

As a material of the bonding member 4, like the bonding member 2, Sn—Cu—Sb solder which is composed mainly of tin and has a high strength, or a Cu—Sn alloy obtained as a result of liquid phase diffusion bonding, is conceived, for example.

However, at least one of the bonding member 2 and the bonding member 4 is required to include the foregoing material, and both of the bonding member 2 and the bonding member 4 are not necessarily required to include the foregoing material.

As a material of the conductive plate 5 and a material of the conductive plate 7, copper or aluminum is conceived, for example. As a material of the insulating ceramics 6, Si—N or Al—N is conceived, for example.

As the insulating substrate 13, available is one which is generally called a direct bonded Cu (DBC) substrate or a direct bonded Al (DBA) substrate. Also, a multilayer insulating substrate such as a DBAC substrate in which the conductive plate 5 or the conductive plate 7 has a laminated configuration of copper and aluminum (Cu/Al/Ceramics/Al/Cu) is available.

As a material of the sealing member 8, an epoxy resin is conceived, for example. In this case, a transfer-mold sealing member which is formed by transfer molding or the like is conceived.

As a material of a lead frame, copper or a laminated member of Cu-Invar-Cu (CIC) is conceived, for example.

The semiconductor chip 11 is an SiC MOSFET or an Si IGBT, for example. Though not shown in the drawings, a case where a diode chip is provided alongside is also conceivable.

The water jacket 21 is manufactured by aluminum die casting, for example. The cooler top plate 22 is an aluminum alloy, for example. The water jacket 21 and the cooler top plate 22 are integrated with each other by welding or the like which also contributes to sealing, so that the cooler 20 is formed.

As a material of the bonding member 24 which bonds an upper electrode in an upper surface of the semiconductor chip 11 and the lead frame 9a, Su-Cu solder or the like is conceived, for example. Likewise, as a material of the bonding member 44, Su-Cu solder or the like is conceived, for example. However, the conductive plate 7 and the lead frame 9b may be bonded directly to each other by an ultrasonic bonding process or the like without inclusion of the bonding member 44.

Each of the above-cited materials is suitable for a case where the submodules 51 are of a transfer-mold type and are required to be mass-manufactured in the same shape.

Figure 5:
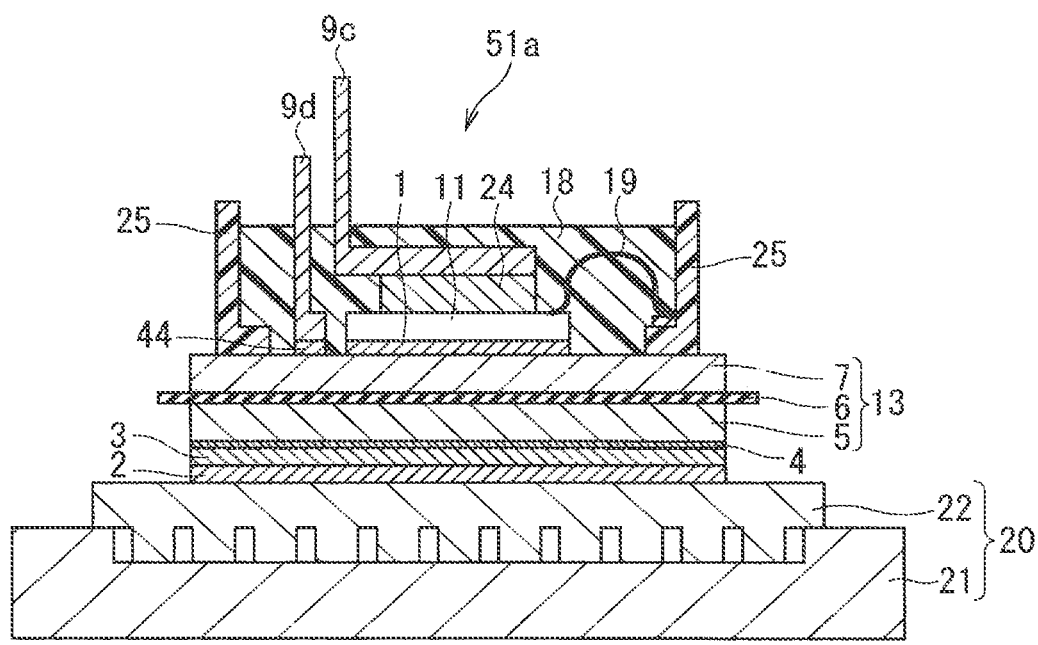
FIG. 5 is a cross-sectional view of a submodule regarding the embodiments in a case where the submodule includes a frame.

On the other hand, as illustratively shown in FIG. 5, a submodule 51a which is configured in such a manner that a sealing member 18 is flown into a frame 25 after the frame 25 is adhered onto the insulating substrate 13 and a wire 19 is formed by wire-bonding, can be used. It is noted that FIG. 5 is a cross-sectional view of a submodule in a case where the submodule includes a frame.

In order to manufacture a power module using the submodule 51a, it is necessary to perform a step of solder-bonding to the cooler 20 as later described. Thus, the submodule 51a should have heat resistance enough to withstand such a solder-bonding step.

As a material of the sealing member 18, an epoxy-based potting resin or a silicone gel is conceived, for example. As a material of the frame 25, a high heat-resistant material such as a poly-phenylene-sulfide (PPS) resin or a high heat-resistant liquid-crystal polymer is desirable, for example.

In the submodule 51a having the above-descried configuration, extraction of a lead frame 9c and a lead frame 9d is not restrained by a split in a transfer-molding mold or the like, so that flexibility in wiring is high. Also, upward extraction of a main circuit is allowed, and thus the submodule 51a is suitable for high-density packaging.

Figure 6:
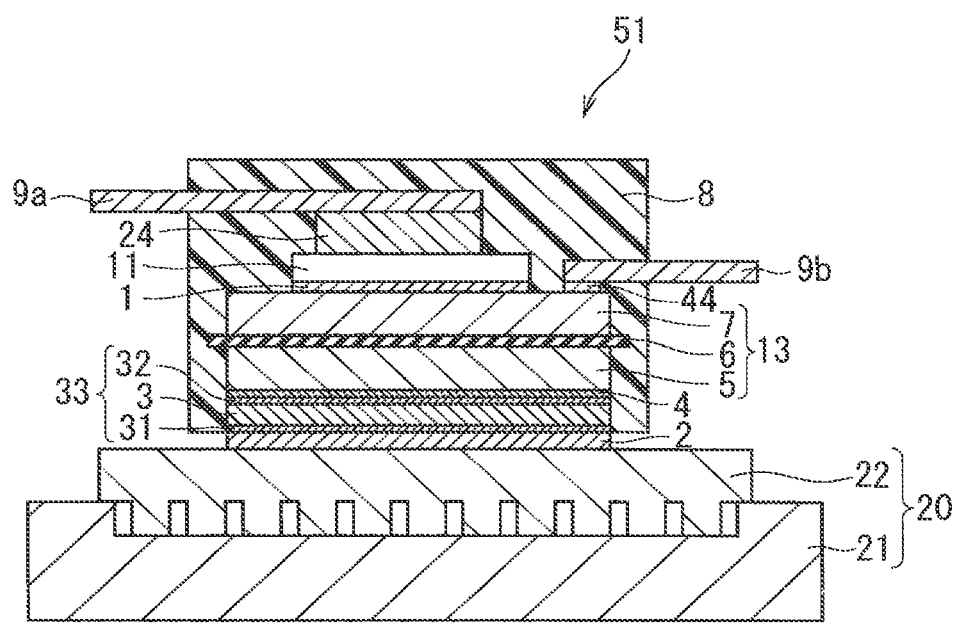
FIG. 6 is a cross-sectional view of a submodule regarding the embodiments in a case where the submodule includes a laminated plate member.

In a case where the aluminum plate member 3 is ultrapure aluminum, in other words, in a case where the aluminum plate member 3 is a plate member formed of aluminum with a purity of 99.999% or higher, it is preferable that a laminated plate member 33 is applied as illustratively shown in FIG. 6, for example, for the reasons stated later. In the laminated plate member 33, the aluminum plate member 3 is interposed between a thin plate 31 and a thin plate 32 each of which is a conductor such as copper, nickel, an Al—Mg—Si-based aluminum alloy, or an Al—Cu-based aluminum alloy, or an insulator such as diamond, and is thin but has a mechanical strength and excellent thermal conductivity. In this regard, a high-strength member means a member having a Young's modulus of 70 GPa or higher, preferably 100 GPa or higher, and a member of excellent thermal conductivity means a member having thermal conductivity of 30 W/m/k or more, preferably 60 W/m/k or more. FIG. 6 is a cross-sectional view of a submodule in a case where the submodule includes a laminated plate member.

Bonding for integration of the thin plate 31, the thin plate 32, and the aluminum plate member 3 can be performed by a bonding process which does not affect a junction of the thin plate 31, the thin plate 32, and the aluminum plate member 3 at a temperature at which a bonding operation using the bonding member 2 is performed, that is, a bonding process having high heat resistance. As an example of such a bonding process, crimping, rolling, pressure-welding, or brazing, can be cited, for example. Additionally, in a case where a bonded surface is aluminum, it is preferable to treat a surface with nickel (Ni) plating or the like so that soldering can be performed.

FIG. 7 through FIG. 12 schematically show cross-sections which are provided after a temperature cycling test in a case where each of the bonding member 2 and the bonding member 4 is Sn—Cu—Sb solder having a high strength, the insulating substrate 13 is a DBC substrate, each of the conductive plate 5 and the conductive plate 7 is copper and has a thickness of approximately 0.4 mm, and a thickness of the insulating ceramics 6 is approximately 0.32 mm, the aluminum plate member 3 is ultrapure aluminum having a thickness of approximately 0.5 mm and is among A member, B member, and C member which are different in purity (respective nominal purities thereof are 6N (99.9999% or higher), 5N (99.999% or higher), and 4N (99.99% or higher)), and the cooler top plate 22 is an aluminum alloy (A6063) having a thickness of approximately 4 mm. It is additionally noted that FIG. 13 shows examples of respective static and cyclic stresses each with a distortion of approximately 2%, of A member, B member, and C member at approximately 125° C.

Figure 7:
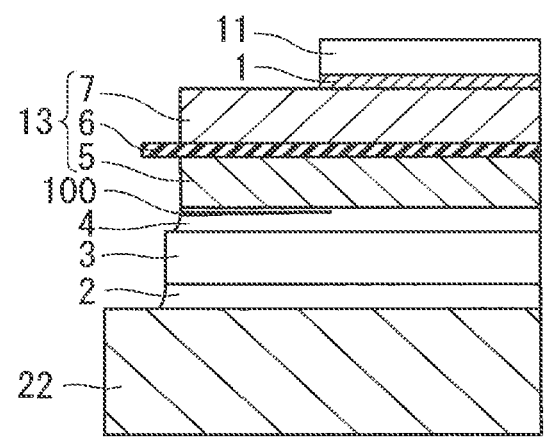
FIG. 7 schematically shows a cross section of a submodule regarding the embodiments after a temperature cycling test (A member).
Figure 8:
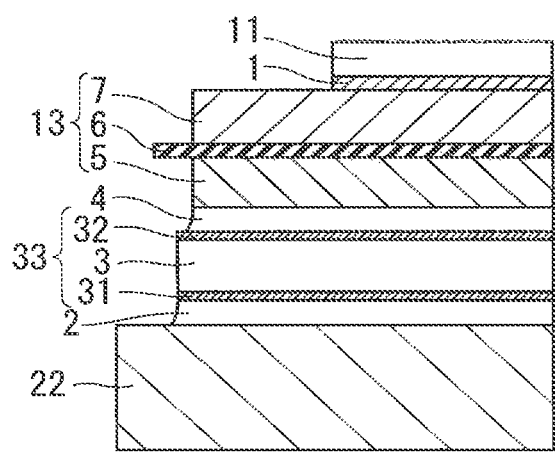
FIG. 8 schematically shows a cross section of a submodule regarding the embodiments after a temperature cycling test (A member with a laminated plate member).
Figure 9:
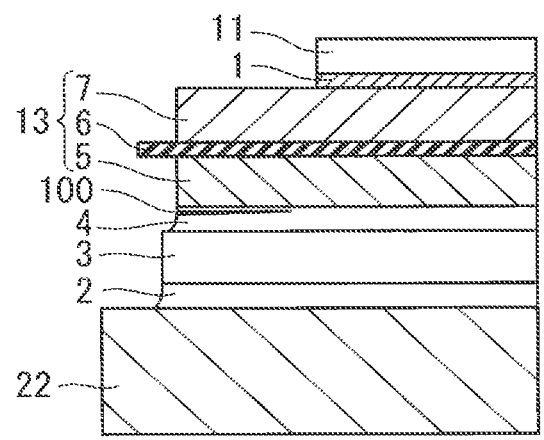
FIG. 9 schematically shows a cross section of a submodule regarding the embodiments after a temperature cycling test (B member).
Figure 10:
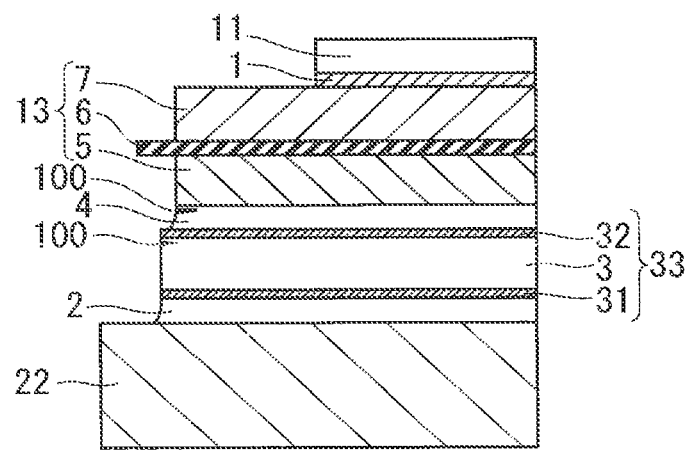
FIG. 10 schematically shows a cross section of a submodule regarding the embodiments after a temperature cycling test (B member with a laminated plate member).

In FIG. 7 and FIG. 8, the aluminum plate member 3 is A member. In FIG. 9 and FIG. 10, the aluminum plate member 3 is B member. In FIG. 11 and FIG. 12, the aluminum plate member 3 is C member. Also, in FIG. 7, FIG. 9, and FIG. 11, the thin plate 31 and the thin plate 32 are not provided. On the other hand, in FIG. 8, FIG. 10, and FIG. 12, the thin plate 31 and the thin plate 32 are provided. In other words, the laminated plate member 33 in which the aluminum plate member 3 is interposed between the thin plate 31 and the thin plate 32 is applied.

Out of the foregoing cases, in each of the cases of FIG. 7, FIG. 9, and FIG. 10, in other words, in each of the cases where the thin plate 31 and the thin plate 32 are not provided, a solder crack 100 occurs in the bonding member 4 provided on a lower surface of the insulating substrate 13. A crack length is the largest in the case of FIG. 7, and is the smallest in the case of FIG. 11.

In the case of FIG. 8, in other words, in the case where the aluminum plate member 3 is A member having a superior purity and the thin plate 31 and the thin plate 32 are provided, no crack occurs. In the case of FIG. 10, in other words, in the case where the aluminum plate member 3 is B member and the thin plate 31 and the thin plate 32 are provided, the solder crack 100 which is tiny occurs in the bonding member 4 provided on a lower surface of the insulating substrate 13. Also, the tiny solder crack 100 occurs also in the aluminum plate member 3. In the case of FIG. 12, in other words, in the case where the aluminum plate member 3 is C member and the thin plate 31 and the thin plate 32 are provided, the solder crack 100 occurs in the bonding member 4 provided on a lower surface of the insulating substrate 13 and the solder crack 100 occurs also in the aluminum plate member 3. It is made clear from the above that a relationship between a purity of aluminum and a crack length varies depending on presence or absence of the thin plate 31 and the thin plate 32. More specifically, while a crack length is longer as a purity of aluminum is higher in a case where the thin plate 31 and the thin plate 32 are not provided, a crack length is shorter as a purity of aluminum is higher in a case where the thin plate 31 and the thin plate 32 are provided.

As a result of serious studies, an ultrapure-aluminum plate member is considered to generate a great thermal stress locally along a thickness, and it has been found that results expected based on mechanical characteristics can be obtained only after restraining motions of the ultrapure-aluminum plate member.

In a case where each of the thin plate 31 and the thin plate 32 is copper, it is difficult to suppress deformation of ultrapure aluminum along a thickness if each of the thin plate 31 and the thin plate 32 has a thickness smaller than 0.1 mm. Accordingly, a thickness should be approximately 0.1 mm at minimum, and is preferably approximately 0.2 mm or larger.

However, when a thickness exceeds approximately 0.5 mm, not only does thermal resistance increase, but also mechanical characteristics of copper affects more noticeably, so that the solder crack 100 occurs in the bonding member 4 even though A member is used. Thus, in a case where each of the thin plate 31 and the thin plate 32 is copper, a thickness thereof is desired to be not less than approximately 0.1 mm and not more than approximately 0.5 mm.

Solder which has a lower melting point (solidus temperature) than the other composing members has a strength (tensile strength) which is sharply reduced at a high temperature. The highest temperature of a junction of a cooler of a water-cooled type and the insulating substrate 13 which are bonded directly to each other is approximately 125° C. At such a temperature, because of a higher strength of the bonding member 2 or the bonding member 4 than that of the aluminum plate member 3, no great plastic deformation is caused in the bonding member the bonding member 4 in a working temperature range, so that propagation of a crack which is likely to be caused by fatigue failure is prevented, and long-term reliability is maintained.

<Manufacturing Method>

Next, a method for manufacturing a semiconductor device regarding the present embodiment will be described. First, as a first example of a manufacturing method, a manufacturing method for a case where the bonding member 4 is a Cu—Sn alloy obtained by liquid phase diffusion bonding and the laminated plate member 33 is bonded to the insulating substrate 13, will be described with reference to FIG. 14 through FIG. 17.

As illustratively shown in FIG. 14, Sn foil or Sn paste having a thickness of not less than approximately 0.02 mm and not more than approximately 0.1 mm is interposed between a lower surface of the insulating substrate 13 and the laminated plate member 33 which is previously formed by integration. Subsequently, further, tin (Sn) is melted by heating together with application of a pressure of not lower than approximately 1 kPa and not higher than approximately 100 kPa. Then, the heating is kept performed for a certain period of time, so that liquid phase diffusion advances, which results in formation of a Cu—Sn alloy. In this manner, the insulating substrate 13 and the laminated plate member 33 are bonded to each other.

In order to obtain a high-quality liquid phase diffusion layer, high flatness and high smoothness of plate members being bonded are important. Accordingly, it is preferable that the above-described step of bonding the insulating substrate 13 and the laminated plate member 33 is a step performed in an initial stage where flatness and smoothness can be easily kept high. It is additionally noted that though FIG. 14 illustratively shows the laminated plate member 33, the aluminum plate member 3 which is copper plated can be used in place of the laminated plate member 33, for example.

Next, as illustratively shown in FIG. 15, a so-called die-bonding step in which the semiconductor chip 11 is bonded to an upper surface of the insulating substrate 13 is performed. The bonding member 1 is prepared such that a melting point or a solidus temperature thereof is higher than the highest temperature reached by the bonding member 1 in a soldering step in which soldering is performed, in order to prevent the bonding member 1 from melting when being soldered in a later step. This requirement is satisfied by a so-called Ag sintering process using a silver nanoparticle, the above-described liquid phase diffusion process, or high melting-point solder, for example. Among those processes, an Ag sintering process, in which low heat resistance can be stably achieved because thermal conductivity is high and a void (blowhole) is unlikely to be formed, is desirable.

Figure 16:
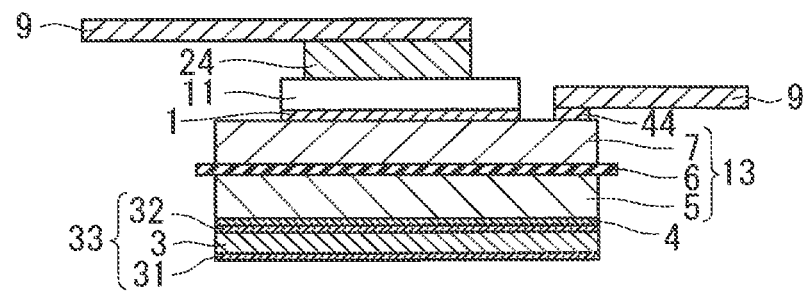
FIG. 16 is a view for explaining a method for manufacturing a semiconductor device regarding the embodiments (a bonding step).

Next, as illustratively shown in FIG. 16, an upper surface of the semiconductor chip 11 is bonded to the lead frame 9a via the bonding member 24. Also, an upper surface of the conductive plate 7 is bonded to the lead frame 9b via the bonding member 44. Each of the bonding member 24 and the bonding member 44 is Su-Cu solder, for example.

Figure 17:
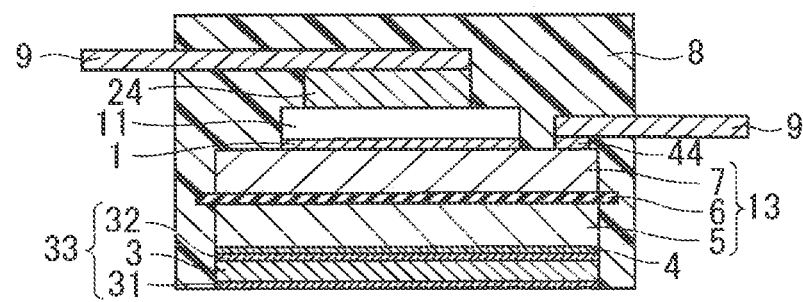
FIG. 17 is a view for explaining a method for manufacturing a semiconductor device regarding the embodiments (a resin forming step).

Next, as illustratively shown in FIG. 17, an epoxy resin is formed by transfer molding or potting, for example. This causes the semiconductor chip 11 and the insulating substrate 13 to be covered with the sealing member 8, so that the submodule 51 is completed.

Next, an inspection of the submodule 51 including electrical characteristics thereof is conducted, and only a conforming product is delivered to a later step.

Finally, the plurality of submodules 51 are bonded to the cooler 20 via the bonding member 2, wiring or other operations including secondary sealing of a whole of the module as needed is performed, so that the power module illustratively shown in FIG. 2 or FIG. 3 is manufactured. It is noted that a configuration illustratively shown in FIG. 3 is a configuration of a power module in which not the laminated plate member 33 but the aluminum plate member 3 is used.

The power module manufactured by the above-described steps, electrical characteristics or the like is inspected for each of the submodules 51 before the plurality of semiconductor chips 11 are fixed to the cooler 20, which eliminates a need to discard a whole of a power module due to malfunction of the single semiconductor chip 11. Also, workability is improved.

Second Embodiment

<Manufacturing Method>

Next, as a second example of a manufacturing method, a manufacturing method for a case where the bonding member 2 is a Cu—Sn alloy obtained by liquid phase diffusion bonding and the laminated plate member 33 is bonded to the cooler 20, will be described with reference to FIG. 18 through FIG. 22.

As illustratively shown in FIG. 18, a so-called die-bonding step in which the semiconductor chip 11 is bonded to the insulating substrate 13 is performed. The bonding member 1 is prepared such that a melting point or a solidus thereof is higher than the highest temperature reached by the bonding member 1 in a soldering step in which soldering is performed, in order to prevent the bonding member 1 from melting when being soldered in a later step. This requirement is satisfied by a so-called Ag sintering process using a silver nanoparticle, the above-described liquid phase diffusion process, or high melting-point solder, for example. Among those processes, an Ag sintering process, in which low heat resistance can be stably achieved because thermal conductivity is high and a void is unlikely to be formed, is desirable.

Next, as illustratively shown in FIG. 19, an upper surface of the semiconductor chip 11 is bonded to the lead frame 9a via the bonding member 24. Also, an upper surface of the conductive plate 7 is bonded to the lead frame 9b via the bonding member 44. Each of the bonding member 24 and the bonding member 44 is Su-Cu solder, for example.

Next, as illustratively shown in FIG. 20, an epoxy resin is formed by transfer molding or potting, for example. This causes the semiconductor chip 11 and the insulating substrate 13 to be covered with the sealing member 8, so that the submodule 51 is completed.

Next, an inspection of the submodule 51 including electrical characteristics thereof is conducted, and only a conforming product is delivered to a later step.

Figure 21:
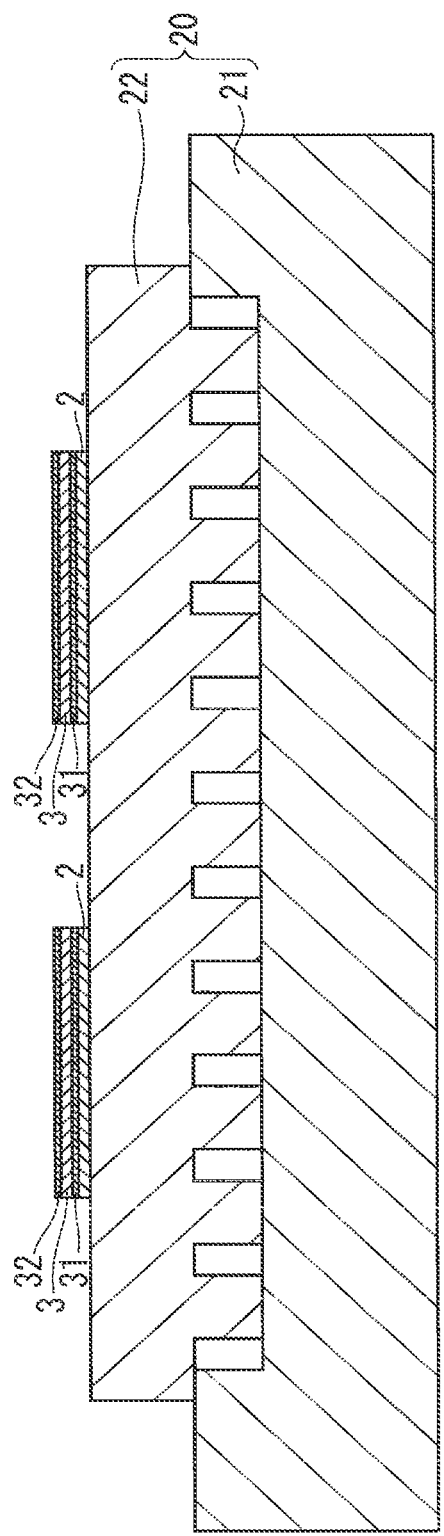
FIG. 21 is a view for explaining a method for manufacturing a semiconductor device regarding the embodiments (a bonding step).

Apart from the foregoing steps, as illustratively shown in FIG. 21, Sn foil or Sn paste having a thickness of not less than approximately 0.02 mm and not more than approximately 0.1 mm is interposed between a lower surface of the laminated plate member 33 and the cooler 20 which is previously formed by integration. Subsequently, further, tin (Sn) is melted by heating together with application of a pressure of not lower than approximately 1 kPa and not higher than approximately 100 kPa. Then, the heating is kept performed for a certain period of time, so that liquid phase diffusion advances, which results in formation of a Cu—Sn alloy. In this manner, the cooler 20 and the laminated plate member 33 are bonded to each other. In this regard, it is preferable that a bonded surface of the cooler top plate 22 is copper plated. It is additionally noted that though FIG. 21 shows the laminated plate member 33, the aluminum plate member 3 which is copper plated can be used in place of the laminated plate member 33, for example, similarly to the manufacturing method according to the first embodiment.

Figure 22:
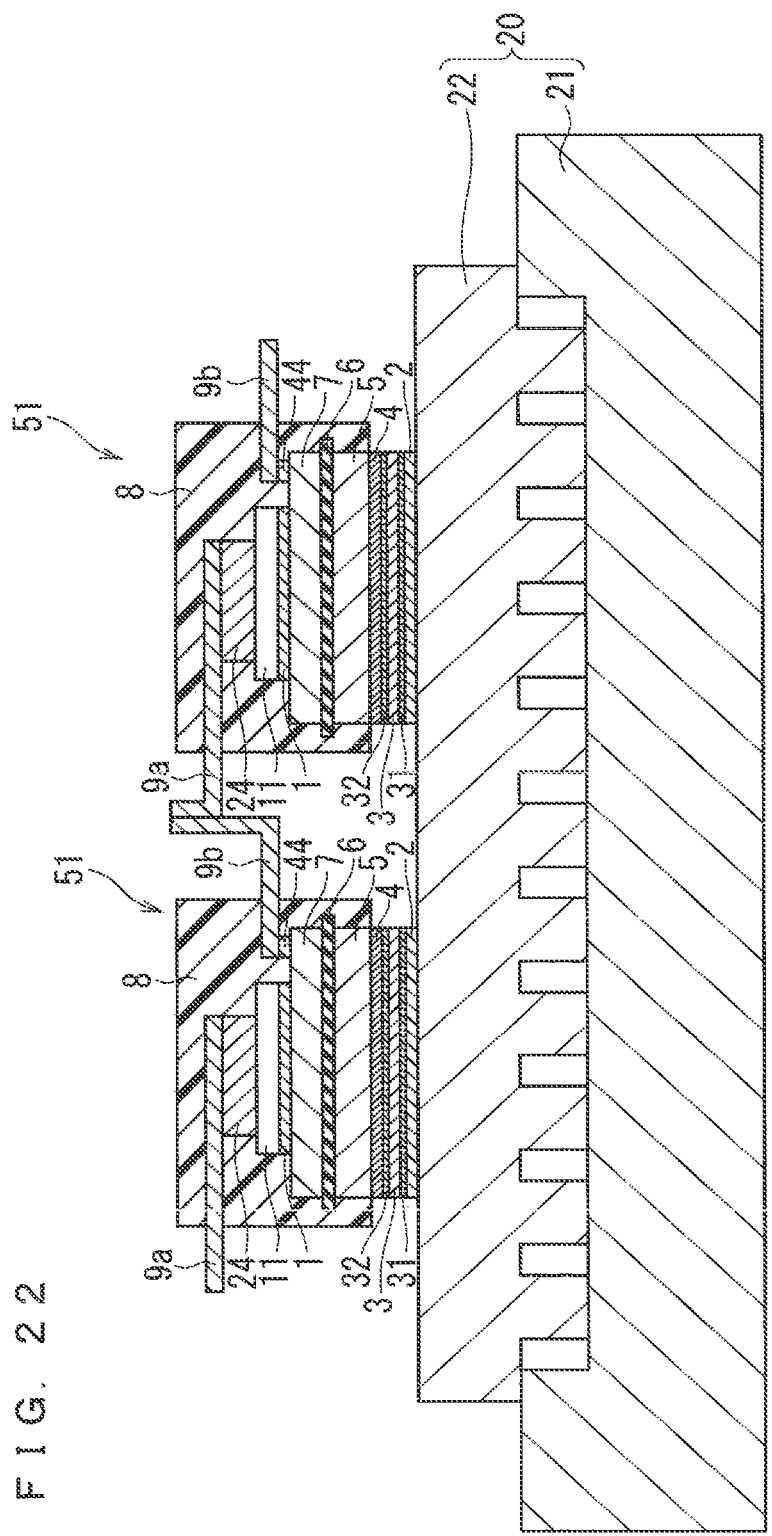
FIG. 22 is a view for explaining a method for manufacturing a semiconductor device regarding the embodiments (a bonding step).

Finally, as illustratively shown in FIG. 22, the plurality of submodules 51 are bonded to the laminated plate member 33 bonded to the cooler 20, via the bonding member 4, wiring or other operations including secondary sealing of a whole of the module as needed is performed, so that the power module is manufactured.

In the case of the second embodiment, since the die-bonding step is the first step in manufacture of a semiconductor device, flatness and smoothness of the insulating substrate 13 during die-bonding is easily kept high, which produces effects of making it easier to apply an Ag sintering process or the like.

Third Embodiment

Next, as a third example of a manufacturing method, description will be made about a case where the bonding member 4 is formed of the same material as the bonding member 2. A method for manufacturing the submodule 51 is similar to the example of manufacturing method described in the second embodiment.

The bonding member 2, the laminated plate member 33, and the bonding member 4 are placed in the stated order from the top, between the submodule 51 and the cooler 20, and those members are simultaneously bonded using a reflow furnace or the like. While a completed configuration is similar to the configuration illustratively shown in FIG. 22, the bonding member 2 and the bonding member 4 are formed of the same material and thus need not be dealt with as distinguished from each other.

In the case of the third embodiment, a bonding step using the bonding member 4 can be omitted as compared to the manufacturing method described in the first embodiment and the manufacturing method described in the second embodiment, so that a power module can be manufactured at a low cost.

It is additionally noted that in the example of manufacturing method shown in the present embodiment, to use ultrapure aluminum as the aluminum plate member 3 in place of the laminated plate member 33 is not preferable because deformation along a thickness becomes extremely noticeable in a temperature cycling test.

Fourth Embodiment

Next, as an example of a method for manufacturing the submodule 51a having the configuration illustratively shown in FIG. 5, a manufacturing method for a case where the bonding member 4 is a Cu—Sn alloy obtained by liquid phase diffusion bonding, and the laminated plate member 33 is bonded to the insulating substrate 13, will be described with reference to FIG. 23 through FIG. 27.

The steps performed up to the die-bonding step are similar to those in the case illustratively shown in FIG. 14 and FIG. 15. Also, though FIG. 23 through FIG. 27 show the laminated plate member 33, the manufacturing method is similar to the manufacturing method described in the first embodiment in that the aluminum plate member 3 which is copper plated can be used, for example.

Figure 23:
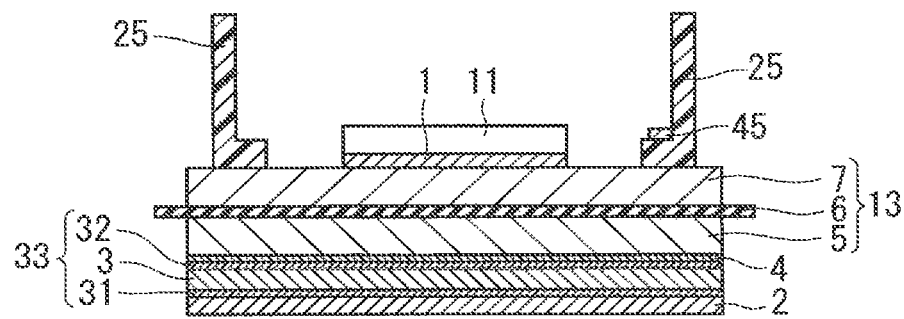
FIG. 23 is a view for explaining a method for manufacturing a semiconductor device regarding the embodiments (an adhering step).

Next, as illustratively shown in FIG. 23, the frame 25 is adhered onto an electrode of the conductive plate 7 with a silicone adhesive or the like, for example. Owing to adherence onto an electrode, no problem arises in insulating properties even if a part of a silicone adhesive peels off and an adhered surface of the frame 25 is loosened during a heat cycle or the like. The frame 25 is formed of a resin having high heat resistance or the like, and an electrode for a control terminal is provided by insert molding or outsert molding.

Figure 24:
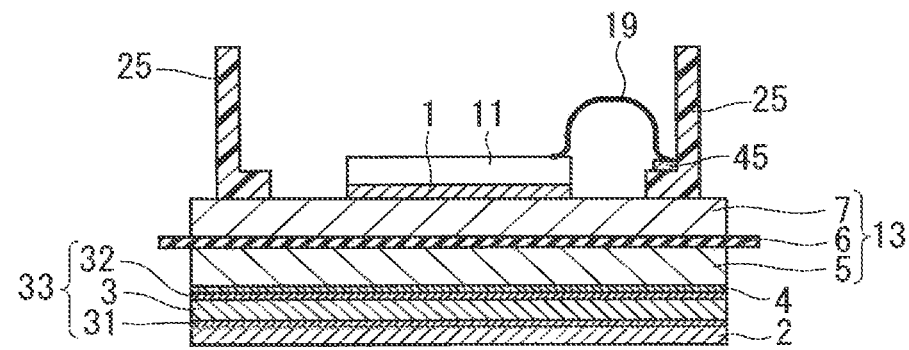
FIG. 24 is a view for explaining a method for manufacturing a semiconductor device regarding the embodiments (a wire-bonding step).

Next, as illustratively shown in FIG. 24, a so-called wire-bonding step is performed, in which a control terminal of the semiconductor chip 11 and a control terminal 45 of the frame 25 are connected to each other by a wire 19 formed of aluminum or the like.

Figure 25:
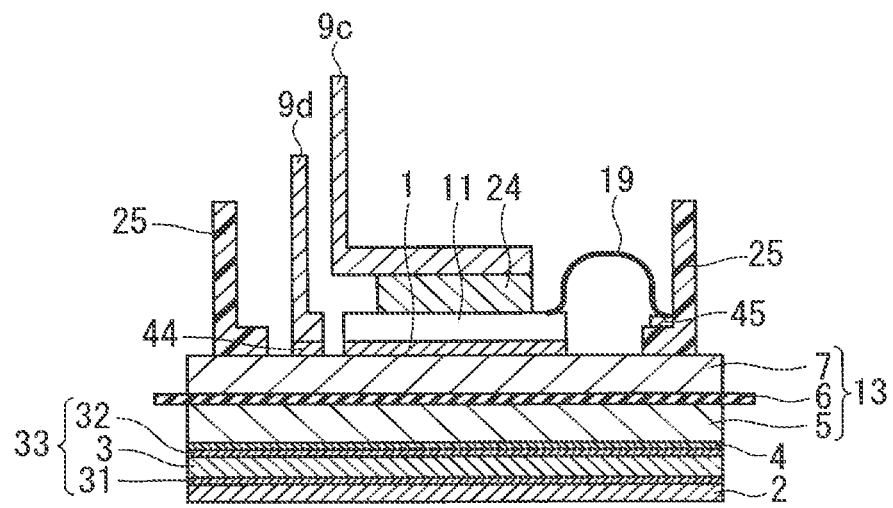
FIG. 25 is a view for explaining a method for manufacturing a semiconductor device regarding the embodiments (a bonding step).

Next, as illustratively shown in FIG. 25, the lead frame 9c is bonded onto the semiconductor chip 11 via the bonding member 24. Also, the lead frame 9d is bonded onto the conductive plate 7 via the bonding member 44. Each of the bonding member 24 and the bonding member 44 is Su-Cu solder, for example.

Figure 26:
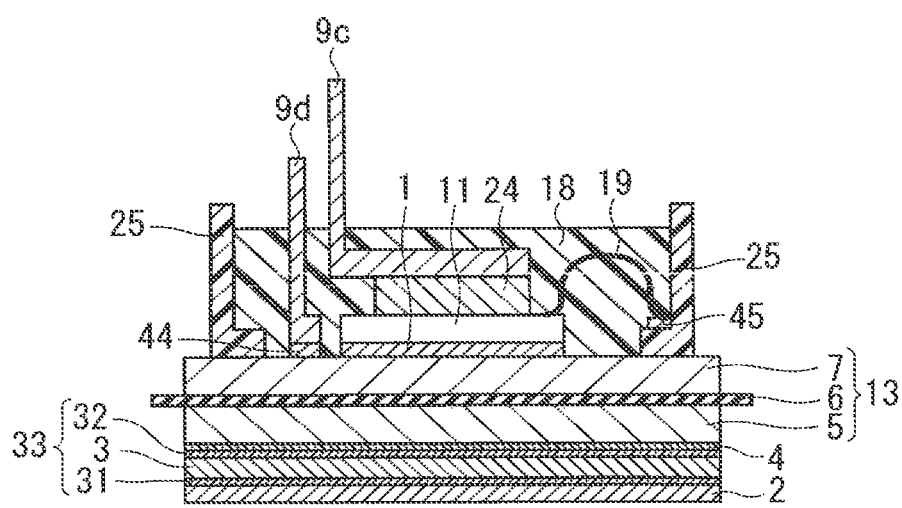
FIG. 26 is a view for explaining a method for manufacturing a semiconductor device regarding the embodiments (a filling step).

Next, as illustratively shown in FIG. 26, an area surrounded by the frame 25 is filled with the sealing member 18 by potting or other processes. The sealing member 18 is an epoxy, a silicone gel, or the like. Then, the submodule 51a is completed.

Next, an inspection of the submodule 51a including electrical characteristics thereof is conducted, and only a conforming product is delivered to a later step.

Figure 27:
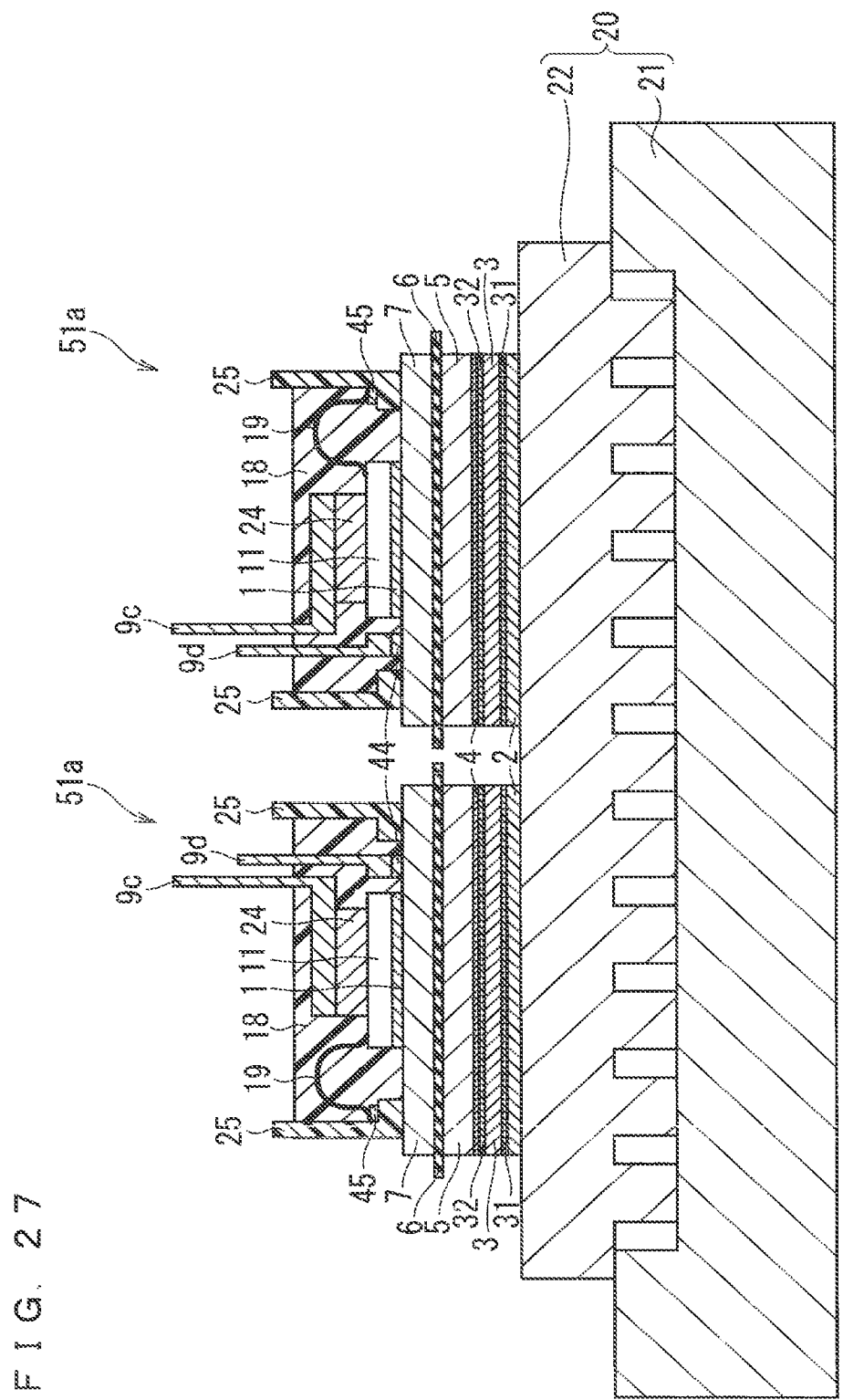
FIG. 27 is a view for explaining a method for manufacturing a semiconductor device regarding the embodiments (a bonding step).

Finally, the plurality of submodules 51a are bonded to the cooler 20 via the bonding member 2, wiring or other operations including secondary sealing of a whole of the module as needed is performed, so that the power module illustratively shown in FIG. 27 is manufactured.

It is additionally noted that a sequence of the steps illustratively shown in FIG. 23, FIG. 24, and FIG. 25 may be appropriately altered. Also, in a case where the sealing member 18 is unnecessary for reasons of an inspection of electrical characteristics of the submodule 51a, filling with the sealing member 18 may be performed after bonding using the bonding member 2.

A power module manufactured by the above-described steps allows a wire (the lead frame 9c and the lead frame 9d) for extracting upward a main circuit to be laid from the submodules 51a, so that interference between main circuits of the adjacent submodules 51a can be avoided. This allows high-density packaging.

Also, because of the above-described potting configuration, a manufacturing method similar to the example of manufacturing method described in the second embodiment and the example of manufacturing method described in the third embodiment can be applied.

It is additionally noted that though in the above-described example of manufacturing method, a case where the water jacket 21 and the cooler top plate 22 in the cooler 20 are previously integrated by welding, brazing or the like processes is described, the cooler 20 can be read as the cooler top plate 22. According to this reading, the cooler top plate 22 is bonded using the bonding member 2, and thereafter, may be sealed to be integrated with the water jacket 21 by friction stir welding (FSW) or the like processes, for example.

As described above, according to the above-described embodiment, by using a plate member which has a cyclic stress not greater than a tensile strength of the bonding member 2 at approximately 125° C. and has excellent thermal conductivity, it is possible to alleviate metal fatigue of a bonding member which is induced by a thermal stress caused due to a difference in thermal expansion coefficient without impairing heat dissipation properties.

Also, electrical characteristics or the like can be inspected for each submodule before a plurality of semiconductor chips are fixed to a cooler, so that a need to discard a whole of a power module due to malfunction of the single semiconductor chip 11 can be prevented from arising. Accordingly, excellent heat transfer properties, reliability, and workability can be achieved.

Effects

Below, effects produced by the above-described embodiments will be illustratively described.

According to the above-described embodiments, a semiconductor device includes the insulating substrate 13, the semiconductor chip 11, the aluminum plate member 3, and the cooler 20.

The insulating substrate 13 includes the insulating ceramics 6 serving as an insulating plate, and the conductive plate 5 and the conductive plate 7 which are provided on opposite surfaces of the insulating ceramics 6. The semiconductor chip 11 is provided on an upper surface of the insulating substrate 13. The aluminum plate member 3 is bonded to a lower surface of the insulating substrate 13. The cooler 20 is bonded to a lower surface of the aluminum plate member 3.

At least one of bonding between a lower surface of the insulating substrate 13 and the aluminum plate member 3, and bonding between a lower surface of the aluminum plate member 3 and the cooler 20, is performed via a bonding member which is composed mainly of tin. A lower surface of the insulating substrate 13 and the aluminum plate member 3 are bonded to each other via the bonding member 4. A lower surface of the aluminum plate member 3 and the cooler 20 are bonded to each other via the bonding member 2. Also, a cyclic stress of the aluminum plate member 3 is smaller than a tensile strength of each of those bonding members.

It is additionally noted that the aluminum plate member 3 can be replaced with the laminated plate member 33.

Because of the above-described configuration, a cyclic stress of the aluminum plate member 3 is smaller than a tensile strength of each of the bonding members, so that metal fatigue of the bonding members which is induced by a thermal stress caused due to a difference in thermal expansion coefficient can be reduced while satisfactory heat transfer properties are maintained. More specifically, even if a semiconductor device is repeatedly subjected to a temperature history (heat cycle), plastic deformation of the bonding member 4 or the bonding member 2 is insignificant, so that accumulation of metal fatigue is suppressed. Consequently, the solder crack 100 hardly occurs in the bonding members, and reliability of the semiconductor device is improved.

It is noted that while components other than the above-described components can be appropriately omitted, the same effects as described above can be produced also in a case where arbitrary components described in this specification are appropriately added.

Also, according to the above-described embodiments, the aluminum plate member 3 is formed of aluminum with a purity of 99.999% or higher.

Because of the foregoing configuration, a proof stress (tensile strength) at approximately 125° C. is approximately 25 MPa of lower, and a proof stress (tensile strength) does not exceed approximately 25 MPa even if repeated curing is performed at approximately 125° C. In other words, a cyclic stress does not exceed approximately 25 MPa.

Also, according to the above-described embodiments, the laminated plate member 33 includes the aluminum plate member 3 formed of aluminum with a purity of 99.999% or higher, and the copper plate member 31 and the copper plate member 32 which are provided on opposite surfaces of the aluminum plate member 3.

Because of the foregoing configuration, deformation of the aluminum plate member 3 along a thickness is suppressed, so that heat-cycle resistance of a bonding member is enhanced.

Also, according to the above-described embodiments, at least one of the bonding member 2 and the bonding member 4 includes six wt % or more of antimony.

Because of the foregoing configuration, a tensile strength of at least one of the bonding member 2 and the bonding member 4 at approximately 125° C. is 25 MPa or higher, so that a tensile stress of a bonding member which includes six wt % or more of antimony is larger than a cyclic stress of the aluminum plate member 3. Thus, it is possible to reduce metal fatigue of a bonding member which is induced by a thermal stress caused due to a difference in thermal expansion coefficient, while maintaining satisfactory heat transfer properties.

Also, according to the above-described embodiments, a cyclic stress of the aluminum plate member 3 at 125° C. is smaller than a tensile strength of at least one of the bonding member 2 and the bonding member 4 at 125° C.

Because of the foregoing configuration, also at 125° C. which is supposed to be the highest temperature of a junction of bonding, a cyclic stress of the aluminum plate member 3 is smaller than a tensile strength of at least one of the bonding member 2 and the bonding member 4 at 125° C.

Also, according to the above-described embodiments, in a method for manufacturing a semiconductor device, an upper surface of the insulating substrate 13 which includes the insulating ceramics 6, the conductive plate 5 and the conductive plate 7 which are provided on opposite surfaces of the insulating ceramics 6, is bonded to the semiconductor chip 11. Subsequently, a lower surface of the insulating substrate 13 and the plate member 3 are bonded. Then, a lower surface of the plate member 3 and the cooler 20 are bonded.

At least one of bonding between a lower surface of the insulating substrate 13 and the plate member 3, and bonding between a lower surface of the plate member 3 and the cooler 20, is performed via a bonding member which is composed mainly of tin. A lower surface of the insulating substrate 13 and the plate member 3 are bonded via the bonding member 4. A lower surface of the plate member 3 and the cooler 20 are bonded via the bonding member 2. Also, a cyclic stress of the plate member 3 is smaller than a tensile strength of each of the bonding members. Further, a temperature at which bonding is performed via the bonding members is lower than a temperature at which an upper surface of the insulating substrate 13 and the semiconductor chip 11 are bonded.

It is additionally noted that the plate member 3 can be replaced with the laminated plate member 33.

Because of the foregoing configuration, since a cyclic stress of the plate member 3 is smaller than a tensile strength of each of the bonding members, metal fatigue of the bonding members which is induced by a thermal stress caused due to a difference in thermal expansion coefficient can be reduced while satisfactory heat transfer properties are maintained. More specifically, even if a semiconductor device is repeatedly subjected to a temperature history (heat cycle), plastic deformation of the bonding member 4 or the bonding member 2 is insignificant, so that accumulation of metal fatigue is suppressed. Consequently, the solder crack 100 hardly occurs in the bonding members, and reliability of the semiconductor device is improved.

Also, a temperature in at least one of bonding between a lower surface of the insulating substrate 13 and the plate member 3, and bonding between a lower surface of the plate member 3 and the cooler 20, is lower than a temperature in bonding an upper surface of the insulating substrate 13 and the semiconductor chip 11, so that electrical characteristics or the like of each of the semiconductor chips 11 can be inspected with the insulating substrate 13 being bonded to the semiconductor chip 11, and thereafter the insulating substrate 13, the plate member 3, and the cooler 20 can be bonded.

Generally, a stress relieving member and an insulating substrate cannot be brazed to each other with a semiconductor chip being mounted onto the insulating substrate in connection with a processing temperature, and so, die-bonding and wire-bonding of a semiconductor chip should be performed in a form of an assembled product (ASSY product) of a substrate including a cooler, a stress relieving member, and an insulating substrate which are integrated.

However, when such a power module as described above is applied to an inverter of a three-phase motor, for example, at least six power semiconductor chips each having a switching function are required, and several tens of power semiconductor chips are used in some cases when applied to an automobile. If malfunction occurs in even a single semiconductor chip in a die-bonding step or a wire-bonding step, a whole of a power module should be discarded, which results in a great loss.

With regard to the foregoing matter, according to the configuration described in the above-described embodiments, since an inspection of electrical characteristics or the like of each of the semiconductor chips 11 can be conducted before the plurality of semiconductor chips 11 are bonded to the cooler 20, there is no need to discard a whole of a power module even if malfunction occurs in the single semiconductor chip 11, which results in a reduced loss.

Also, according to the above-described embodiments, in a method for manufacturing a semiconductor device, an upper surface of the insulating substrate 13 and the semiconductor chip 11 are bonded by an Ag sintering process using an Ag nanoparticle.

Because of the foregoing configuration, a temperature at which an upper surface of the insulating substrate 13 and the semiconductor chip 11 are bonded is higher than the highest temperature reached in a later-performed soldering step. Accordingly, a junction of the bonding is prevented from inciting in a later-performed soldering step. Also, thermal conductivity is high and a void (blowhole) is unlikely to be formed, so that low heat resistance between the insulating substrate 13 and the semiconductor chip 11 can be stably achieved.

Also, according to the above-described embodiments, in a method for manufacturing a semiconductor device, a lower surface of the insulating substrate 13 and the laminated plate member 33 are bonded via the bonding member 4 before an upper surface of the insulating substrate 13 and the semiconductor chip 11 are bonded.

Then, tin foil or tin paste having a thickness of not less than 0.02 mm and not more than 0.1 mm is interposed between a lower surface of the insulating substrate 13 and the laminated plate member 33 in bonding a lower surface of the insulating substrate 13 and the laminated plate member 33 via the bonding member 4, and further, the tin foil or the tin paste is melted by heating together with application of a pressure of not lower than 1 kPa and not higher than 100 kPa, so that the bonding member 4 which is a copper-tin alloy is formed through liquid phase diffusion.

Because of the foregoing configuration, a step of bonding the insulating substrate 13 and the laminated plate member 33 is included as an initial step in which flatness and smoothness are easily kept high, so that a high-quality liquid phase diffusion layer can be obtained.

Also, according to the above-described embodiments, in a method for manufacturing a semiconductor device, a lower surface of the laminated plate member 33 and the cooler 20 are bonded via the bonding member 2 before a lower surface of the insulating substrate 13 and the laminated plate member 33 are bonded.

Then, tin foil or tin paste having a thickness of not less than 0.02 mm and not more than 0.1 mm is interposed between a lower surface of the laminated plate member 33 and the cooler 20 in bonding a lower surface of the laminated plate member 33 and the cooler 20 via the bonding member 2, and further, the tin foil or the tin paste is melted by heating together with application of a pressure of not lower than 1 kPa and not higher than 100 kPa, so that the bonding member 2 which is a copper-tin alloy is formed through liquid phase diffusion.

Because of the foregoing configuration, flatness and smoothness of the insulating substrate 13 during die-bonding are easily kept high, so that an Ag sintering process or the like can be more easily applied.

Also, according to the above-described embodiments, in a method for manufacturing a semiconductor device, the sealing member 8 with which at least the insulating substrate 13 and the semiconductor chip 11 are covered is formed by potting.

Because of the foregoing configuration, as a result of the insulating substrate 13 and the semiconductor chip 11 being covered with the sealing member 8, a power module can be completed.

Modifications

While properties, materials, dimensions, shapes, positional interrelationships, conditions for implementation, or the like of respective components have been described in some portions in the above-described embodiments, those are mere examples in all aspects, and those described in this specification impose no limitation. Accordingly, numerous modifications which are not illustratively described are conceivable within a scope of the present techniques. For example, there are included a case where an arbitrary component is transformed, is added, or is omitted, and further a case where at least one component in at least one embodiment is extracted and is combined with a component in another embodiment.

Also, unless contradiction arises, a component which has been described as being "one" in the above-described embodiments may be "more than one" component. Further, each of components is a conceptual unit, and there are included a case where one component includes a plurality of structures, a case where one component corresponds to a part of a certain structure, and further, a case where a plurality of components are included in one structure. Also, each of components can include a structure having a different configuration or a different shape so far as the same function is exhibited.

Also, description in the present specification should be referred to for all objects of the present techniques, and no portion therein acknowledges being conventional arts.

REFERENCE SIGNS LIST

1, 2, 4, 24, 44: bonding member, 3: plate member, 5, 7: conductive plate, 6: insulating ceramics, 8, 18: sealing member, 9a, 9b, 9c, 9d: lead frame, 11: semiconductor chip, 13: insulating substrate, 19: wire, 20: cooler, 21: water jacket, 22: cooler top plate; 22a: fin-shaped portion, 25: frame, 31, 32: thin plate, 33: laminated plate member, 45: control terminal, 51, 51a: submodule, 100: solder crack

The invention claimed is:

1. A semiconductor device comprising:
   an insulating substrate including an insulating plate and conductive plates which are provided on opposite surfaces of said insulating plate;
   a semiconductor chip provided on an upper surface of said insulating substrate;
   a plate member bonded to a lower surface of said insulating substrate; and
   a cooler bonded to a lower surface of said plate member, wherein
   at least one of bonding between the lower surface of said insulating substrate and said plate member and bonding between the lower surface of said plate member and said cooler is performed via a bonding member which is composed mainly of tin,
   a cyclic stress of said plate member is smaller than a tensile strength of said bonding member; and
   a thickness of said conductive plates is greater than a thickness of said plate member in a direction of said lower surface of said insulating substrate to said lower surface of said plate member.

2. The semiconductor device according to claim 1, wherein
   said plate member is formed of aluminum with a purity of 99.999% or higher.

3. The semiconductor device according to claim 1, wherein
   said plate member includes an aluminum plate member formed of aluminum with a purity of 99.999% or higher, and conductive members which are provided on opposite surfaces of said aluminum plate member.

4. The semiconductor device according to claim 3, wherein
   said conductive members are copper, and
   each of said conductive members which are provided on opposite surfaces of said aluminum plate member has a thickness of 0.1 mm or larger.

5. The semiconductor device according to claim 3, wherein
   said aluminum plate member and said conductive members are bonded by crimping, rolling, pressure welding, or brazing.

6. The semiconductor device according to claim 1, wherein
   said bonding member includes six wt % or more of antimony.

7. The semiconductor device according to claim 1, wherein
   said cyclic stress of said plate member at 125° C. is smaller than said tensile strength of said bonding member at 125° C.

8. The semiconductor device according to claim 1, comprising:
   a lower surface of said semiconductor chip bonded to an upper surface of one said conductive plates;
   said lower surface of said plate member bonded to an upper surface of said cooler; and
   a lower surface of another one of said conductive plates bonded to an upper surface of said plate member.

9. The semiconductor device according to claim 1, wherein:
   said plate member includes an aluminum plate member formed of aluminum with a purity of 99.999% or higher; and
   said conductive plates are copper.

10. The semiconductor device according to claim 9, wherein said bonding member is composed of a Sn—Cu—Sb solder.

11. The semiconductor device according to claim 9, comprising copper members which are provided on opposite surfaces of said aluminum plate member.

12. The semiconductor device according to claim 1, wherein:
- said plate member includes an aluminum plate member formed of aluminum with a purity of 99.999% or higher; and
- said conductive plates are aluminum.

13. The semiconductor device according to claim 12, comprising said bonding member composed of a Sn—Cu—Sb solder.

14. The semiconductor device according to claim 12, comprising copper members which are provided on opposite surfaces of said aluminum plate member.

\* \* \* \* \*